US008053375B1

(12) United States Patent
Xu et al.

(10) Patent No.: US 8,053,375 B1
(45) Date of Patent: Nov. 8, 2011

(54) SUPER-DRY REAGENT COMPOSITIONS FOR FORMATION OF ULTRA LOW K FILMS

(75) Inventors: Chongying Xu, New Milford, CT (US); Jeffrey F. Roeder, Brookfield, CT (US); Thomas H. Baum, New Fairfield, CT (US); Steven M. Bilodeau, Oxford, CT (US); Scott Battle, Cedar Park, TX (US); William Hunks, Waterbury, CT (US); Tianniu Chen, Rocky Hill, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 1046 days.

(21) Appl. No.: 11/925,838

(22) Filed: Oct. 27, 2007

Related U.S. Application Data

(60) Provisional application No. 60/864,301, filed on Nov. 3, 2006.

(51) Int. Cl.
*H01L 21/00* (2006.01)
*C07F 7/08* (2006.01)
*C07C 7/00* (2006.01)

(52) U.S. Cl. ............ 438/778; 556/465; 585/2; 585/800; 585/833

(58) Field of Classification Search .................. 556/465; 585/2, 800, 833; 438/778
See application file for complete search history.

(56) References Cited

U.S. PATENT DOCUMENTS

| | | | |
|---|---|---|---|
| 4,087,448 A | 5/1978 | Rossmy et al. | |
| 4,127,598 A | 11/1978 | McEntee et al. | |
| 4,156,689 A | 5/1979 | Ashby et al. | |
| 4,257,775 A | 3/1981 | Ladov et al. | |
| 4,374,110 A | 2/1983 | Darnell et al. | |
| 4,745,169 A | 5/1988 | Sugiyama et al. | |
| 4,755,370 A | 7/1988 | Kray et al. | |
| 5,043,789 A | 8/1991 | Linde et al. | |
| 5,047,492 A | 9/1991 | Weidner et al. | |
| 5,098,865 A | 3/1992 | Machado et al. | |
| 5,210,250 A | 5/1993 | Watanuki et al. | |
| 5,276,173 A | 1/1994 | Marko et al. | |
| 5,879,649 A | 3/1999 | Henderson et al. | |
| 6,147,009 A | 11/2000 | Grill et al. | |
| 6,162,711 A * | 12/2000 | Ma et al. ....................... 438/558 | |
| 6,171,945 B1 | 1/2001 | Mandal et al. | |
| 6,331,494 B1 | 12/2001 | Olson et al. | |
| 6,368,359 B1 | 4/2002 | Perry et al. | |
| 6,383,955 B1 | 5/2002 | Matsuki et al. | |
| 6,410,463 B1 | 6/2002 | Matsuki | |
| 6,420,441 B1 | 7/2002 | Allen et al. | |
| 6,451,712 B1 | 9/2002 | Dalton et al. | |
| 6,486,082 B1 | 11/2002 | Cho et al. | |
| 6,495,479 B1 | 12/2002 | Wu et al. | |
| 6,528,409 B1 | 3/2003 | Lopatin et al. | |
| 6,630,520 B1 * | 10/2003 | Bruza et al. ..................... 521/77 | |
| 6,670,285 B2 | 12/2003 | Hawker et al. | |
| 6,846,515 B2 * | 1/2005 | Vrtis et al. ............... 427/255.29 | |
| 6,858,697 B2 | 2/2005 | Mayorga et al. | |
| 6,936,551 B2 | 8/2005 | Moghadam et al. | |
| 6,946,382 B2 * | 9/2005 | Townsend et al. ............ 438/619 |
| 7,011,864 B2 | 3/2006 | Ishida | |
| 7,041,748 B2 * | 5/2006 | Lin et al. ........................ 525/474 |
| 7,049,247 B2 * | 5/2006 | Gates et al. ................... 438/778 |
| 7,056,560 B2 | 6/2006 | Yim et al. | |
| 7,060,330 B2 | 6/2006 | Zheng et al. | |
| 7,101,948 B2 | 9/2006 | Mayorga et al. | |
| 7,108,771 B2 | 9/2006 | Xu et al. | |
| 7,166,531 B1 * | 1/2007 | van den Hoek et al. ....... 438/623 |
| 7,189,571 B1 | 3/2007 | Borovik et al. | |
| 7,208,389 B1 * | 4/2007 | Tipton et al. ................... 438/409 |
| 7,357,977 B2 * | 4/2008 | Dimitrakopoulos et al. ........................... 428/312.6 |
| 7,423,166 B2 * | 9/2008 | Chen et al. ..................... 556/464 |
| 7,799,705 B1 * | 9/2010 | Wu et al. ......................... 438/781 |
| 2002/0030297 A1 * | 3/2002 | Gallagher et al. .............. 264/49 |
| 2002/0142579 A1 | 10/2002 | Vincent et al. | |
| 2003/0044531 A1 | 3/2003 | Ishida | |
| 2003/0077918 A1 | 4/2003 | Wu et al. | |
| 2003/0124785 A1 | 7/2003 | Xu et al. | |
| 2003/0146451 A1 | 8/2003 | Huang et al. | |

(Continued)

FOREIGN PATENT DOCUMENTS

| | | | |
|---|---|---|---|
| EP | 1 321 469 A1 | | 6/2003 |
| JP | 10-251276 | * | 9/1998 |
| WO | 2004027110 A2 | | 4/2004 |

OTHER PUBLICATIONS

Grill, Alfred, et al., "Novel low-k dual-phase materials prepared by PECVD", Mat. Res. Soc. Symp. Proc., 2000, vol. 612.
Hanson, K.J., et al., "Determination of trace water in propylene carbonate using hexafluoroacetone", J. Electroanal. Chem., Sep. 25, 1987, pp. 107-117, vol. 234, No. 1-2.
Laxman, Ravi K., et al., "Synthesizing Low-K CVD Materials for Fab Use", Semiconductor International, Nov. 1, 2000.

(Continued)

*Primary Examiner* — Evan Pert

(74) *Attorney, Agent, or Firm* — Steven J. Hultquist; Hultquist IP; Maggie Chappuis

(57) ABSTRACT

An ultra low k dielectric film, including a silicon film containing porosity deriving from a porogen, as formed from a precursor silane and a porogen, wherein the precursor silane has a water content below 10 ppm, based on total weight of the precursor silane, and/or the porogen has a water content below 10 ppm, based on total weight of the porogen. In one implementation, the precursor silane is diethoxymethylsilane, and the porogen is bicyclo[2.2.1]-hepta-2,5-diene having a trace water content below 10 ppm, based on total weight of said bicyclo[2.2.1]-hepta-2,5-diene. These super-dry reagents are unexpectedly polymerization-resistant during their delivery and deposition in the formation of ultra low k films, and are advantageously employed to produce ultra low k films of superior character.

25 Claims, No Drawings

U.S. PATENT DOCUMENTS

| | | |
|---|---|---|
| 2003/0232137 A1 | 12/2003 | Vrtis et al. |
| 2004/0028916 A1* | 2/2004 | Waldfried et al. ............ 428/447 |
| 2004/0039219 A1 | 2/2004 | Chen et al. |
| 2004/0087184 A1 | 5/2004 | Mandal et al. |
| 2004/0102006 A1* | 5/2004 | Xu et al. ...................... 438/259 |
| 2004/0130027 A1* | 7/2004 | Chen et al. ................... 257/758 |
| 2004/0137243 A1 | 7/2004 | Gleason et al. |
| 2005/0130404 A1 | 6/2005 | Moghadam et al. |
| 2005/0181613 A1 | 8/2005 | Xu et al. |
| 2005/0268849 A1 | 12/2005 | Ishida |
| 2008/0105978 A1* | 5/2008 | Schmitt et al. ................ 257/751 |
| 2010/0052115 A1* | 3/2010 | McAndrew et al. .......... 257/632 |

OTHER PUBLICATIONS

Mantz, R.A., et al., "Thermolysis of Polyhedral Oligomeric Silsesquioxane (POSS) Macromers and POSS-Siloxane Copolymers", Chem. Mater., Jun. 1996, pp. 1250-1259, vol. 8, No. 6.

* cited by examiner

SUPER-DRY REAGENT COMPOSITIONS FOR FORMATION OF ULTRA LOW K FILMS

CROSS-REFERENCE TO RELATED APPLICATION

This application claims the benefit under 35 USC 119 of U.S. Provisional Patent Application No. 60/864,301 filed Nov. 3, 2006 in the names of Chongying Xu, et al. for "SUPER-DRY REAGENT COMPOSITIONS FOR FORMATION OF ULTRA LOW K FILMS." The disclosure of U.S. Provisional Patent Application No. 60/864,301 is hereby incorporated herein by reference in its entirety, for all purposes.

BACKGROUND OF THE INVENTION

1. Field of the Invention

This invention relates to formation of ultra low k films and to reagents suitable for such use.

2. Description of the Related Art

A wide variety of reagents are actively being investigated for use in forming ultra low dielectric constant (k) films on substrates, in connection with development of next generation microelectronic devices. As used herein, the term "ultra low dielectric constant" refers to a dielectric constant below 2.

In continuing efforts to reduce k values of thin films in microelectronic device fabrication, various compositions involving porosity-forming reagents, i.e., porogens, have been developed. By generating porosity in the dielectric film, the void volume (having a dielectric constant of ~1) contributes to an overall lowering of the dielectric constant of the film containing such porosity.

Many organics have been considered for use as pore generators. Among them, bicyclo[2.2.1]-hepta-2,5-diene (BCHD) is a promising candidate, however, its use for forming dielectric constant films requires that the material be of very high purity. High purity BCHD, however, can be unstable, and readily polymerizes. This in turn creates the possibility of clogging of reagent delivery lines in the semiconductor process system, and of unwanted polymerization deposits in the deposition chamber.

Diethoxymethylsilane (DMS) is used as a precursor for plasma-enhanced chemical vapor deposition (PECVD) of ultra low k films. However, DMS is susceptible to polymerization and resultant clogging behavior in the delivery lines of the process system.

The art has a continuing need for improved porogen and precursor materials for forming ultra low k dielectric films.

SUMMARY OF THE INVENTION

The present invention relates to reagents useful for forming ultra low k dielectric films, as well as to processes of utilizing such reagents in chemical vapor deposition and other film-forming processes to produce ultra low k films.

In one embodiment, the invention relates to an ultra low k dielectric film, including a silicon film containing porosity deriving from a porogen, as formed from a precursor silane and a porogen, wherein the precursor silane has a water content below 10 ppm, based on total weight of the precursor silane, and the porogen has a water content below 10 ppm, based on total weight of the porogen.

Another aspect of the invention relates to a method of making an ultra low k film on a substrate, comprising depositing on said substrate silicon from a precursor silane having a water content below 10 ppm, based on total weight of the precursor silane.

In a further aspect, the invention relates to a method of making an ultra low k film on a substrate, comprising depositing on said substrate an ultra low k film precursor and a porogen, wherein said porogen has a water content below 10 ppm, based on total weight of the porogen.

In one aspect, the invention relates to bicyclo[2.2.1]-hepta-2,5-diene having a trace water content below 10 parts per million (ppm), preferably below 5 ppm and more preferably below 1 ppm, based on total weight of said bicyclo[2.2.1]-hepta-2,5-diene.

In a further aspect, the invention relates to bicyclo[2.2.1]-hepta-2,5-diene having a trace oxygen content below 10 ppm, preferably below 5 ppm and more preferably below 1 ppm, based on total weight of said bicyclo[2.2.1]-hepta-2,5-diene.

Another aspect of the invention relates to a method of forming an ultra low k dielectric film, comprising depositing a film-forming material from a precursor including bicyclo[2.2.1]-hepta-2,5-diene, wherein said bicyclo[2.2.1]-hepta-2,5-diene has been purified to remove trace water and oxygen therefrom, so that said bicyclo[2.2.1]-hepta-2,5-diene contains a water concentration below 10 ppm, preferably below 5 ppm and more preferably below 1 ppm, based on total weight of the bicyclo[2.2.1]-hepta-2,5-diene.

A still further aspect of the invention relates to a method of forming an ultra low k film comprising silicon, said method comprising depositing material on a substrate from a precursor vapor of diethoxymethylsilane, wherein said diethoxymethylsilane has been treated to reduce water content thereof to a concentration below 10 ppm, preferably below 5 ppm and more preferably below 1 ppm, based on total weight of the diethoxymethylsilane.

A still further aspect of the invention relates to a method of forming an ultra low k film comprising silicon, said method comprising depositing material in a substrate from a precursor vapor of diethoxymethylsilane, wherein said diethoxymethylsilane has been treated to reduce chlorine (halogen) content thereof to a concentration below 10 ppm, preferably below 5 ppm, more preferably below 2 ppm, and even more preferably below 1 ppm, based on the weight of said diethoxymethylsilane.

In yet another aspect, the invention relates to a method of forming an ultra low k dielectric film on a substrate, comprising depositing on said substrate silicon from a precursor including diethoxymethylsilane and a porogen from a porogen precursor including bicyclo[2.2.1]-hepta-2,5-diene, wherein said diethoxymethylsilane is in mixture with trace water in an amount below 10 ppm, based on the total weight of said diethoxymethylsilane and said bicyclo[2.2.1]-hepta-2,5-diene is in mixture with trace water in an amount below 10 ppm, based on the total weight of said bicyclo[2.2.1]-hepta-2,5-diene.

Another aspect of the invention relates to an ultra low k dielectric film containing porosity deriving from a porogen, as formed from film precursor and the porogen, wherein the film precursor has a water content ≦10 ppm, based on total weight of the precursor, and/or the porogen has a water content ≦10 ppm, based on total weight of the porogen.

In another aspect, the invention relates to an ultra low k dielectric film reagent, selected from the group consisting of:
(a) bicyclo[2.2.1]-hepta-2,5-diene having a water content ≦ 10 ppm;
(b) bicyclo[2.2.1]-hepta-2,5-diene having a water content ≦ 10 ppm, protectively isolated from water and oxygen contamination by an inert gas;

(c) distilled bicyclo[2.2.1]-hepta-2,5-diene having a water content ≦10 ppm;
(d) bicyclo[2.2.1]-hepta-2,5-diene having a water content ≦ 10 ppm, protectively isolated from water, oxygen and light exposure;
(e) bicyclo[2.2.1]-hepta-2,5-diene having a water content ≦ 10 ppm, in mixture with a radical inhibitor;
(f) diethoxymethylsilane having a water content ≦10 ppm;
(g) diethoxymethylsilane having a water content ≦10 ppm, and a chlorine content ≦10 ppm;
(h) diethoxymethylsilane having a water content ≦10 ppm, in mixture with a drying agent;
(i) diethoxymethylsilane having a water content ≦10 ppm, in mixture with a chlorine scavenging agent;
(j) azeotropically distilled diethoxymethylsilane having a water content ≦10 ppm, in mixture with a radical inhibitor;
(k) diethoxymethylsilane having a water content ≦10 ppm, in mixture with an end capping agent;
(l) dimethoxymethylsilane having a water content ≦10 ppm;
(m) dimethoxymethylsilane having a water content ≦10 ppm, and a chlorine content ≦10 ppm;
(n) dimethoxymethylsilane having a water content ≦10 ppm, in mixture with a drying agent;
(o) dimethoxymethylsilane having a water content ≦10 ppm, in mixture with a chlorine scavenging agent;
(p) azeotropically distilled dimethoxymethylsilane having a water content ≦10 ppm, in mixture with a radical inhibitor;
(q) dimethoxymethylsilane having a water content ≦10 ppm, in mixture with an end capping agent;
(r) diethoxyethylsilane having a water content ≦10 ppm;
(s) diethoxyethylsilane having a water content ≦10 ppm, and a chlorine content ≦10 ppm;
(t) diethoxyethylsilane having a water content ≦10 ppm, in mixture with a drying agent;
(u) diethoxyethylsilane having a water content ≦10 ppm, in mixture with a chlorine scavenging agent;
(v) azeotropically distilled diethoxyethylsilane having a water content ≦10 ppm, in mixture with a radical inhibitor;
(w) diethoxyethylsilane having a water content ≦10 ppm, in mixture with an end capping agent; and
(x) combinations of two or more of the foregoing.

In a further aspect, the invention relates to a method of forming an ultra low k film on a substrate, comprising depositing on the substrate an ultra low k film precursor and a porogen, wherein the ultra low k film precursor has a water content ≦10 ppm, based on total weight of the precursor, and/or the porogen has a water content ≦10 ppm, based on total weight of the porogen.

Another aspect of the invention relates to a method of making a reagent for forming an ultra low k silicon containing film, wherein the source material for the reagent includes at least one of a silane precursor and a porogen, such method comprising treating said source material to produce a reagent having ≦10 ppm water content, based on the total weight of the reagent.

In a further aspect, the invention relates to a method of operating a semiconductor process system comprising reagent delivery lines and a deposition chamber adapted to form an ultra low k silicon containing film on a substrate using silane precursor and porogen reagents, to suppress polymerization in the delivery lines and deposition chamber, such method comprising using as the silane precursor a dialkoxyalkylsilane having ≦10 ppm water content, based on the total weight of the dialkoxyalkylsilane, and/or using as the porogen a bicyclodiene having ≦10 ppm water content, based on the total weight of the bicyclodiene.

Other aspects, features and advantages of the invention will be more fully apparent from the ensuing disclosure and appended claims.

DETAILED DESCRIPTION OF THE INVENTION, AND PREFERRED EMBODIMENTS THEREOF

The present invention relates to reagents having utility for forming ultra low k dielectric films for fabrication of microelectronic devices, as well as to deposition processes using such reagents.

As noted in the background section hereof, diethoxymethylsilane (DMS) has been used as a precursor for plasma-enhanced chemical vapor deposition (PECVD) of ultra low k films, but such reagent is susceptible to polymerization and resultant clogging behavior in the delivery lines of the process system. The present inventors have discovered that the water content in DMS needs to be very low in order to inhibit polymerization.

Another issue arising in the use of DMS as a precursor for fabricating ultra low k films is the potential for high chlorine content of such reagent, since the present inventors have discovered that chlorine negatively affect the long term performance of microelectronic devices, and that high chlorine content is a potential cause of polymerization and clogging during the fabrication process.

The present invention reflects the discovery that water, at low levels heretofore thought to be insignificant, nonetheless is extremely detrimental to the manufacturability and performance of ultra low k dielectric films, when present in silane precursors for silicon low k films and/or when present in the porogens utilized to introduce porosity in low k films. The present invention correspondingly reflects the discovery that when water in such silane precursors and/or porogens does not exceed 10 ppm, the susceptibility of such precursors and porogens to polymerize and clog delivery lines of such materials in the semiconductor process system and/or to form undesired polymerization deposits in the deposition chamber is effectively suppressed.

In one aspect, the present invention relates to an ultra low k dielectric film, including a silicon film containing porosity deriving from a porogen, as formed from a precursor silane and a porogen, wherein the precursor silane has a water content below 10 ppm, based on total weight of the precursor silane, and/or the porogen has a water content below 10 ppm, based on total weight of the porogen.

The precursor silane can be of any suitable type, and can for example be a dialkoxyalkylsilane, such as diethoxymethylsilane (DMS), dimethoxymethylsilane, and diethoxyethylsilane, etc.

In like manner, the porogen can be of any suitable type, and can for example include bicyclo-dienes such as bicyclo [2.2.1]-hepta-2,5-diene.

In one embodiment of the present invention, bicyclo [2.2.1]-hepta-2,5-diene (BCHD) is treated to remove trace water therefrom, to such extent as to produce a super-dry BCHD product.

As used herein, the term "super-dry" means that the content of water is less than 10 ppm percent of the BCHD. The term "film" refers to a material layer having a thickness of less than 1 micrometer.

In one embodiment, the BCHD material is subjected to distillation and purification under nitrogen protection over a drying agent, to remove trace water and oxygen. After the distillation and purification, the BCHD is excluded from oxygen exposure by protecting the BCHD in helium or other suitable inert gas, e.g., argon, nitrogen, krypton, etc.

In one embodiment, a radical inhibitor such as butylated hydroxytoluene (BHT) is added to the BCHD to enhance its stability. BHT may be added in any suitable concentration, but in general an amount of from about 0.001 percent to about 0.10 percent by weight, based on the weight of BCHD, can be advantageously employed.

The resulting purified and super-dry BCHD provides a reagent enabling highly reproducible chemical vapor deposition processes to be carried out in order to form ultra low k dielectric films. As a result of its super-dry and pure character, such BCHD affords substantially improved performance in respect of its reduced susceptibility to polymerization and resultant clogging of delivery passages in the chemical vapor deposition delivery system.

The present invention also contemplates a new composition of diethoxymethylsilane (DMS), which is distilled over a drying agent to produce super-dry DMS after distillation. A chlorine-scavaging agent preferably is employed with the drying agent to further remove chlorine. After distillation/purification, the dried and purified DMS is further stabilized with a radical inhibitor, such as butylated hydroxytoluene (BHT), ethyl vanillin, butylated hydroxyanisole (BHA), etc.

The dried and purified DMS in addition to stabilization with a radical inhibitor may be stabilized with an end capping agent, to prevent polymerization of the DMS.

Suitable drying agents may be of any appropriate type. Preferred drying agents include, without limitation, $CaH_2$, CaO, MgO, $MgSO_4$, NaH, LiH, KH, $P_2O_5$, and the like. Azeotropical distillation may be employed for drying, using benzene, isopropyl ether, or other suitable azeotropic distillation solvents.

Suitable chlorine scavaging agents may be of any appropriate type. Preferred agents include, without limitation, ethanol/sodium ethoxide, ethanol/organic amine, such as trimethylamine, triethylamine and others, silver-nitrate-zeolite, silver-nitrate-silica, ion-exchange resin, activated alumina, etc.

The end capping agent utilized to suppress polymerization may be of any suitable type that is effective when reacted with the DMS to cap the polymerizable functionality of such compound. The end capping agent can for example be an organosiloxane. Particularly preferred end capping agents include $Me_3Si$—O-MeHSi—O—$SiMe_3$ and the like.

The features and advantages of the present invention are more fully shown with respect to the following non-limiting example.

EXAMPLE 1

A 12 L flask equipped with a condenser is charged with 5000 g of diethoxymethylsilane (DMS) and 50 g of $CaH_2$ and a magnetic stir bar. The water content of the raw DMS is reduced by heating the mixture to reflux for 10 hours with stirring under nitrogen protection. The condenser then is replaced by a distillation head and distillation of the DMS is initiated. After 170 g of fore-cuts are received, 3470 g of dry DMS are collected. The water content in the dry DMS is analyzed as being below 10 ppm.

BCHD is freshly distilled over activated alumina, sodium, or potassium under inert gas protection. Once distilled, BCHD can be stored below 0° C.

While the invention has been described with respect to illustrative features, aspects and embodiments, it will be appreciated that the invention is not thus limited, but rather extends to and encompasses other variations, modifications and alternative embodiments, as will readily suggest themselves to those of ordinary skill in the art based on the disclosure herein. Accordingly, the invention as hereinafter claimed is intended to be broadly construed to include all such variations, modifications and alternative embodiments, as being within the spirit and scope of the invention.

What is claimed is:

1. An ultra low k dielectric film reagent, selected from the group consisting of:
   (a) bicyclo[2.2.1]-hepta-2,5-diene having a water content $\leq$10 ppm, and a temperature below 0° C.;
   (b) bicyclo[2.2.1]-hepta-2,5-diene having a water content $\leq$10 ppm, protectively isolated from water and oxygen contamination by at least one gas selected from the group consisting of helium, argon, nitrogen and krypton;
   (c) bicyclo[2.2.1]-hepta-2,5-diene having a water content $\leq$10 ppm, in mixture with a radical inhibitor selected from the group consisting of BHT, BHA and ethyl vanillin;
   (d) diethoxymethylsilane having a water content $\leq$10 ppm, being azeotropically distilled with a distillation solvent selected from the group consisting of benzene and isopropyl ether;
   (e) diethoxymethylsilane having a water content $\leq$10 ppm, and a chlorine content $\leq$10 ppm, based on weight of the diethoxymethylsilane;
   (f) diethoxymethylsilane having a water content $\leq$10 ppm, in mixture with a drying agent selected from the group consisting of $CaH_2$, CaO, MgO, $MgSO_4$, NaH, LiH, KH and $P_2O_5$;
   (g) diethoxymethylsilane having a water content $\leq$10 ppm, in mixture with a chlorine scavenging agent selected from the group consisting of ethanol/sodium ethoxide, ethanol/organic amines, silver-nitrate-zeolite, silver-nitrate-silica, ion-exchange resin, and activated alumina;
   (h) diethoxymethylsilane having a water content $\leq$10 ppm, in mixture with a radical inhibitor selected from the group consisting of BHT, BHA and ethyl vanillin;
   (i) diethoxymethylsilane having a water content $\leq$10 ppm, in mixture with an end capping agent comprising $Me_3Si$—O-MeHSi—O—$SiMe_3$; and
   (j) combinations of two or more of the foregoing.

2. The ultra low k dielectric film reagent of claim 1, wherein said reagent comprises bicyclo[2.2.1]-hepta-2,5-diene protectively isolated from water and oxygen contamination by at least one gas selected from the group consisting of helium, argon, nitrogen and krypton.

3. The ultra low k dielectric film reagent of claim 1, wherein said reagent comprises bicyclo[2.2.1]-hepta-2,5-diene in mixture with a radical inhibitor selected from the group consisting of BHT, BHA and ethyl vanillin.

4. The ultra low k dielectric film reagent of claim 1, wherein said reagent comprises bicyclo[2.2.1]-hepta-2,5-diene in mixture with BHT at concentration of from about 0.001 to about 0.10% by weight, based on weight of the bicyclo [2.2.1]-hepta-2,5-diene.

5. The ultra low k dielectric film reagent of claim 1, wherein said reagent comprises diethoxymethylsilane, having at least one characteristic selected from the group consisting of (i) chlorine content $\leq$10 ppm, based on weight of the diethoxymethylsilane, (ii) being in mixture with a drying agent selected from the group consisting of $CaH_2$, CaO, MgO, $MgSO_4$, NaH, LiH, KH and $P_2O_5$, (iii) being azeotropically distilled with a distillation solvent selected from the group consisting of benzene and isopropyl ether, (iv) being in mixture with a chlorine scavenging agent selected from the group consisting of ethanol/sodium ethoxide, ethanol/organic amines, silver-nitrate-zeolite, silver-nitrate-silica, ion-exchange resin, and activated alumina, (v) being in mixture with a radical inhibitor selected from the group consisting of BHT, BHA and ethyl vanillin, (vi) being in mixture with an end capping agent comprising Me$_3$Si—O-MeHSi—O—SiMe$_3$.

6. The ultra low k dielectric film reagent of claim 1, wherein said reagent comprises bicyclo[2.2.1]-hepta-2,5-diene having a temperature below 0° C.

7. A method of forming an ultra low k film on a substrate, comprising depositing on the substrate an ultra low k film precursor and a porogen, wherein the ultra low k film precursor comprises an ultra low k dielectric film reagent according to claim 1.

8. The method of claim 7, wherein said depositing comprises chemical vapor deposition.

9. The method of claim 7, wherein said depositing comprises plasma-enhanced chemical vapor deposition.

10. The method of claim 7, wherein said low k film precursor comprises a diethoxymethylsilane, having at least one characteristic selected from the group consisting of (i) chlorine content $\leq$10 ppm, based on weight of the diethoxymethylsilane, (ii) being in mixture with or purified by distillation over a drying agent selected from the group consisting of CaH$_2$, CaO, MgO, MgSO$_4$, NaH, LiH, KH and P$_2$O$_5$, (iii) being azeotropically distilled with a distillation solvent selected from the group consisting of benzene and isopropyl ether, (iv) being in mixture with a chlorine scavenging agent selected from the group consisting of ethanol/sodium ethoxide, ethanol/organic amines, silver-nitrate-zeolite, silver-nitrate-silica, ion-exchange resin, and activated alumina, (v) being in mixture with a radical inhibitor selected from the group consisting of BHT, BHA and ethyl vanillin, and (vi) being in mixture with an end capping agent comprising Me$_3$Si—O-MeHSi—O—SiMe$_3$.

11. The method of claim 7, wherein said porogen comprises a bicyclodiene having at least one characteristic selected from the group consisting of (i) being in mixture with a radical inhibitor selected from the group consisting of BHT, BHA and ethyl vanillin, at a concentration of from about 0.001 to about 0.10% by weight, based on the weight of the bicyclodiene, (ii) protectively isolated from water and oxygen contamination by at least one gas selected from the group consisting of helium, argon, nitrogen and krypton, and (iii) being purified by distillation carried out under conditions including an inert gas atmosphere and presence of a drying agent selected from the group consisting of activated alumina, sodium and potassium.

12. A method of making a reagent for forming an ultra low k silicon containing film, wherein the source material for the reagent includes at least one of a silane precursor and a porogen, said method comprising treating said source material to produce a reagent having $\leq$10 ppm water content, based on the total weight of the reagent, wherein the silane precursor comprises diethoxymethylsilane, optionally in mixture with at least one of a radical inhibitor and an end capping agent, and the porogen comprises a bicyclodiene.

13. A method of making a reagent for forming an ultra low k silicon containing film, wherein the source material for the reagent includes at least one of a silane precursor and a porogen, said method comprising treating said source material to produce a reagent having $\leq$10 ppm water content, based on the total weight of the reagent, (A) wherein the silane precursor comprises a dialkoxyalkylsilane, having at least one characteristic selected from the group consisting of (i) chlorine content $\leq$10 ppm, based on weight of the dialkoxyalkylsilane, (ii) being in mixture with or purified by distillation over a drying agent selected from the group consisting of CaH$_2$, CaO, MgO, MgSO$_4$, NaH, LiH, KH and P$_2$O$_5$, (iii) being azeotropically distilled with a distillation solvent selected from the group consisting of benzene and isopropyl ether, (iv) being in mixture with a chlorine scavenging agent selected from the group consisting of ethanol/sodium ethoxide, ethanol/organic amines, silver-nitrate-zeolite, silver-nitrate-silica, ion-exchange resin, and activated alumina, (v) being in mixture with a radical inhibitor selected from the group consisting of BHT, BHA and ethyl vanillin, and (vi) being in mixture with an end capping agent comprising Me$_3$Si—O-MeHSi—O—SiMe$_3$, and (B) wherein the porogen comprises a bicyclodiene having at least one characteristic selected from the group consisting of (i) being in mixture with a radical inhibitor selected from the group consisting of BHT, BHA and ethyl vanillin, at a concentration of from about 0.001 to about 0.10% by weight, based on the weight of the bicyclodiene, (ii) protectively isolated from water and oxygen contamination by at least one gas selected from the group consisting of helium, argon, nitrogen and krypton, and (iii) being purified by distillation carried out under conditions including an inert gas atmosphere and presence of a drying agent selected from the group consisting of activated alumina, sodium and potassium.

14. The method of claim 12, wherein the reagent includes at least one component selected from the group consisting of:
(a) bicyclo[2.2.1]-hepta-2,5-diene having a water content $\leq$10 ppm, and a temperature below 0° C.;
(b) bicyclo[2.2.1]-hepta-2,5-diene having a water content $\leq$10 ppm, protectively isolated from water and oxygen contamination by at least one gas selected from the group consisting of helium, argon, nitrogen and krypton;
(c) bicyclo[2.2.1]-hepta-2,5-diene having a water content $\leq$10 ppm, in mixture with a radical inhibitor selected from the group consisting of BHT, BHA and ethyl vanillin;
(d) diethoxymethylsilane having a water content $\leq$10 ppm, being azeotropically distilled with a distillation solvent selected from the group consisting of benzene and isopropyl ether;
(e) diethoxymethylsilane having a water content $\leq$10 ppm, and a chlorine content $\leq$10 ppm, based on weight of the diethoxymethylsilane;
(f) diethoxymethylsilane having a water content $\leq$10 ppm, in mixture with a drying agent selected from the group consisting of CaH$_2$, CaO, MgO, MgSO$_4$, NaH, LiH, KH and P$_2$O$_5$;
(g) diethoxymethylsilane having a water content $\leq$10 ppm, in mixture with a chlorine scavenging agent selected from the group consisting of ethanol/sodium ethoxide, ethanol/organic amines, silver-nitrate-zeolite, silver-nitrate-silica, ion-exchange resin, and activated alumina;
(h) diethoxymethylsilane having a water content $\leq$10 ppm, in mixture with a radical inhibitor selected from the group consisting of BHT, BHA and ethyl vanillin;
(i) diethoxymethylsilane having a water content $\leq$10 ppm, in mixture with an end capping agent comprising Me$_3$Si—O-MeHSi—O—SiMe$_3$;
(j) combinations of two or more of the foregoing.

15. A method of operating a semiconductor process system comprising reagent delivery lines and a deposition chamber adapted to form an ultra low k silicon containing film on a substrate using a reagent including silane precursor and porogen, to suppress polymerization in the delivery lines and deposition chamber, said method comprising said reagent having ≦10 ppm water content, based on the total weight of the reagent, wherein the silane precursor comprises diethoxymethylsilane, and wherein said porogen comprises a bicyclodiene.

16. The method according to claim 15, wherein said deposition chamber comprises a chemical vapor deposition chamber.

17. The method according to claim 15, (A) wherein the diethoxymethylsilane has at least one characteristic selected from the group consisting of (i) chlorine content ≦10 ppm, based on weight of the diethoxymethylsilane, (ii) being in mixture with or purified by distillation over a drying agent selected from the group consisting of $CaH_2$, CaO, MgO, $MgSO_4$, NaH, LiH, KH and $P_2O_5$, (iii) being azeotropically distilled with a distillation solvent selected from the group consisting of benzene and isopropyl ether, (iv) being in mixture with a chlorine scavenging agent selected from the group consisting of ethanol/sodium ethoxide, ethanol/organic amines, silver-nitrate-zeolite, silver-nitrate-silica, ion-exchange resin, and activated alumina, (v) being in mixture with a radical inhibitor selected from the group consisting of BHT, BHA and ethyl vanillin, and (vi) being in mixture with an end capping agent comprising $Me_3Si$—O-MeHSi—O—$SiMe_3$, and (B) wherein the bicyclodiene has at least one characteristic selected from the group consisting of (i) being in mixture with a radical inhibitor selected from the group consisting of BHT, BHA and ethyl vanillin, at a concentration of from about 0.001 to about 0.10% by weight, based on the weight of the bicyclodiene, (ii) protectively isolated from water and oxygen contamination by at least one gas selected from the group consisting of helium, argon, nitrogen and krypton, and (iii) being purified by distillation carried out under conditions including an inert gas atmosphere and presence of a drying agent selected from the group consisting of activated alumina, sodium and potassium.

18. The method of claim 15, wherein said diethoxymethylsilane is selected from the group consisting of:
(a) diethoxymethylsilane having a water content ≦10 ppm;
(b) diethoxymethylsilane having a water content ≦10 ppm, and a chlorine content ≦10 ppm;
(c) diethoxymethylsilane having a water content ≦10 ppm, in mixture with a drying agent;
(d) diethoxymethylsilane having a water content ≦10 ppm, in mixture with a chlorine scavenging agent;
(e) azeotropically distilled diethoxymethylsilane having a water content ≦10 ppm, in mixture with a radical inhibitor;
(f) diethoxymethylsilane having a water content ≦10 ppm, in mixture with an end capping agent; and
(g) combinations of two or more of the foregoing (a)-(f); and said bicyclodiene is selected from the group consisting of:
(h) bicyclo[2.2.1]-hepta-2,5-diene having a water content ≦10 ppm;
(i) bicyclo[2.2.1]-hepta-2,5-diene having a water content ≦10 ppm, protectively isolated from water and oxygen contamination by an inert gas;
(j) distilled bicyclo[2.2.1]-hepta-2,5-diene having a water content ≦10 ppm;
(k) bicyclo[2.2.1]-hepta-2,5-diene having a water content ≦10 ppm, protectively isolated from water, oxygen and light exposure;
(l) bicyclo[2.2.1]-hepta-2,5-diene having a water content ≦10 ppm, in mixture with a radical inhibitor; and
(m) combinations of two or more of the foregoing (h)-(l).

19. The ultra low k dielectric film reagent of claim 1, comprising diethoxymethylsilane having a water content ≦10 ppm, and characterized by at least one of the characteristics of: (i) being azeotropically distilled with a distillation solvent select from the group consisting of benzene and isopropyl ether; and (ii) having a chlorine content ≦10 ppm, based on weight of the diethoxymethylsilane.

20. The ultra low k dielectric film reagent of claim 1, comprising diethoxymethylsilane having a water content ≦10 ppm, and characterized by at least one of the characteristics of: (i) being in mixture with a drying agent selected from the group consisting of $CaH_2$, CaO, MgO, $MgSO_4$, NaH, LiH, KH and $P_2O_5$; (ii) being in mixture with a chlorine scavenging agent selected from the group consisting of ethanol/sodium ethoxide, ethanol/organic amines, silver-nitrate-zeolite, silver-nitrate-silica, ion-exchange resin, and activated alumina; (iii) being in mixture with a radical inhibitor selected from the group consisting of BHT, BHA and ethyl vanillin; and (iv) being in mixture with an end capping agent comprising $Me_3Si$—O-MeHSi—O—$SiMe_3$.

21. The method of claim 13, wherein the dialkoxyalkylsilane has a chlorine content ≦10 ppm, based on weight of the dialkoxyalkylsilane.

22. The method of claim 13, wherein the dialkoxyalkylsilane is characterized by at least one of the characteristics of: (i) being in mixture with or purified by distillation over a drying agent selected from the group consisting of $CaH_2$, CaO, MgO, $MgSO_4$, NaH, LiH, KH and $P_2O_5$; (ii) being in mixture with a chlorine scavenging agent selected from the group consisting of ethanol/sodium ethoxide, ethanol/organic amines, silver-nitrate-zeolite, silver-nitrate-silica, ion-exchange resin, and activated alumina; (iii) being in mixture with a radical inhibitor selected from the group consisting of BHT, BHA and ethyl vanillin; (iv) being in mixture with an end capping agent comprising $Me_3Si$—O-MeHSi—O—$SiMe_3$.

23. The method of claim 13, characterized by at least one of the characteristics of: (i) the dialkoxyalkylsilane being azeotropically distilled with a distillation solvent select from the group consisting of benzene and isopropyl ether; and (ii) the porogen comprising a bicyclodiene purified by distillation carried out under conditions including an inert gas atmosphere and presence of a drying agent selected from the group consisting of activated alumina, sodium and potassium.

24. The method of claim 13, wherein the porogen comprises a bicyclodiene in mixture with a radical inhibitor selected from the group consisting of BHT, BHA and ethyl vanillin, at a concentration of from about 0.001 to about 0.10% by weight, based on weight of the bicyclodiene.

25. The method of claim 13, wherein the porogen comprises a bicyclodiene protectively isolated from water and oxygen contamination by at least one gas selected from the group consisting of helium, argon, nitrogen and krypton.

* * * * *